United States Patent
Ladurner et al.

(10) Patent No.: US 8,093,763 B2
(45) Date of Patent: Jan. 10, 2012

(54) SYSTEM AND METHOD FOR LIMITING CURRENT OSCILLATION

(75) Inventors: Markus Ladurner, Villach (AT);
Alberto Zanardi, Latschach (AT);
Robert Illing, Villach (AT)

(73) Assignee: Infineon Technologies AG, Neubiberg (DE)

( * ) Notice: Subject to any disclaimer, the term of this patent is extended or adjusted under 35 U.S.C. 154(b) by 520 days.

(21) Appl. No.: 12/242,578

(22) Filed: Sep. 30, 2008

(65) Prior Publication Data
US 2010/0079119 A1  Apr. 1, 2010

(51) Int. Cl.
*H01H 35/00* (2006.01)
*H01H 83/00* (2006.01)
*H01H 47/00* (2006.01)
*H02H 3/00* (2006.01)

(52) U.S. Cl. ....................................................... 307/131
(58) Field of Classification Search .................... 307/131
See application file for complete search history.

(56) References Cited

U.S. PATENT DOCUMENTS
6,016,260 A   1/2000  Heeringa
6,069,950 A * 5/2000  Knollman ..................... 379/413

FOREIGN PATENT DOCUMENTS
DE        694 28 884 T2    6/2002
WO    WO 2005/122372 A1   12/2005

* cited by examiner

*Primary Examiner* — Rexford Barnie
*Assistant Examiner* — Dru Parries
(74) *Attorney, Agent, or Firm* — Slater & Matsil, L.L.P.

(57) ABSTRACT

A system and method for limiting current oscillation in power supplies. A method for operating a power supply comprises entering a current limitation mode, setting a current limit for a current flowing through a power switch of the power supply, and in response to determining a current limit has changed from a high value to a low value or detecting an occurrence of a fault condition, setting the current limit to the low value, and locking the current limit so that the current limit does not change. The method further comprises providing a current to a load coupled to the power supply.

21 Claims, 4 Drawing Sheets

SYSTEM AND METHOD FOR LIMITING CURRENT OSCILLATION

TECHNICAL FIELD

The present invention relates generally to a system and a method for power supplies, and more particularly to a system and method for limiting current oscillation in power supplies.

BACKGROUND

A current limitation mode is often supported in many modern power switches. In current limitation mode, a limit may be imposed on current ($I_D$) flowing through a power switch. The value of the current limitation may be dependant on a voltage drop across the power switch. For example, if the power switch is a DMOS transistor, then the value of the current limitation may be based on a drain-source voltage ($V_{DS}$) of the transistor.

FIG. 1a illustrates an example of a two-level current limitation with a curve 105 displaying a current flowing through a power switch. A two-level current limitation may include asserting a high current limitation $I_{D\ HIGH}$ if $V_{DS}$ is less than a threshold ($V_{DSX}$) and a low current limitation $I_{D\ LOW}$ if $V_{DS}$ is greater than the threshold. Therefore, if $V_{DS}$ is less than $V_{DSX}$, then the high current limitation $I_{D\ HIGH}$ would be asserted and if $V_{DS}$ is greater than $V_{DSX}$, then the low current limitation $I_{D\ LOW}$ would be asserted.

However, in a fault condition, such as a short circuit at an output of the power switch in combination with typical impedances of cabling/wiring used to connect the power switch to a battery and/or a load, for example, current oscillation may occur if $V_{DS}$ is slightly larger than $V_{DSX}$. If $V_{DS}$ is slightly higher than $V_{DSX}$, then ideally the low current limitation $I_{D\ LOW}$ may be used to regulate the current flowing through the power switch. Then, in a fault situation wherein the current $I_D$ begins to rise, the voltage $V_{DS}$ may drop below the threshold $V_{DSX}$ due to the impedance of the cabling/wiring. The change in the voltage $V_{DS}$ may be expressed as:

$$V_{coil}(t) = L * \frac{di(t)}{dt},$$

where $V_{coil}(t)$ is the voltage $V_{DS}$, i(t) is a time varying current, and L is the inductance of the cable/wiring.

As the voltage $V_{DS}$ drops below the threshold $V_{DSX}$, then the high current limitation $I_{D\ HIGH}$ may be used to regulate the current flowing through the power switch instead of the low current limitation $I_{D\ LOW}$. Then, when the current flowing through the power switch achieves the high current limitation $I_{D\ HIGH}$, a voltage drop over the cabling/wiring may decrease, thereby causing the voltage $V_{DS}$ to increase. If the voltage $V_{DS}$ increases over the threshold $V_{DSX}$, then once again, the low current limitation $I_{D\ LOW}$ may be used to regulate the current flowing through the power switch. This alternating behavior is referred to as current oscillation. The current oscillation may continue until a control signal of the power switch changes or the power switch shuts down due to overheating.

FIG. 1b illustrates a data plot 150. The data plot 150 displays a first trace 155 displaying a power switch control signal (labeled "IN"), a second trace 160 displaying a voltage produced by a battery coupled to the power switch (labeled "$V_{bat}$"), a third trace 165 displaying an output voltage (labeled "$V_{out}$"), and a fourth trace 170 displaying a current flowing through the power switch (labeled "$I_D$"). The drain-source voltage $V_{DS}$ may be related to the output voltage $V_{out}$, for example, in a relationship expressible as $V_{DS}=V_{bat}-V_{out}$. Therefore, when the output voltage $V_{out}$ is increasing, the voltage $V_{DS}$ may be decreasing, and vice versa.

As the output voltage $V_{out}$ increases (highlight 175), the voltage $V_{DS}$ may be decreasing. When the voltage $V_{DS}$ drops below the threshold $V_{DSX}$, the high current limitation $I_{D\ HIGH}$ may be used to regulate the current flowing through the power switch instead of the low current limitation $I_{D\ LOW}$. The change in the current limitation may allow for the current $I_D$ to increase from a low value to a high value (highlight 177). As the current $I_D$ increases and reaches the high current limitation $I_{D\ HIGH}$, the voltage $V_{DS}$ may also increase and may once again exceed the threshold $V_{DSX}$ (shown as decreasing output voltage $V_{out}$ and highlight 179 on the third trace 165). When the voltage $V_{DS}$ increases above the threshold $V_{DSX}$, the low current limitation $I_{D\ LOW}$ may be used to regulate the current flowing through the power switch instead of the high current limitation $I_{D\ HIGH}$ and the current $I_D$ may decrease (highlight 181).

As shown in FIG. 1b, the current oscillations may repeat. The current oscillation may stop if the switch control signal changes value or the power switch overheats and shuts down to help prevent damage to the power switch. If the power switch shuts down to prevent damage from overheating, once it is back on, the current oscillation may continue until the switch control signal changes or the power switch overheats once again.

SUMMARY OF THE INVENTION

These and other problems are generally solved or circumvented, and technical advantages are generally achieved, by preferred embodiments which provide a system and method limiting current oscillation in power supplies.

In accordance with a preferred embodiment, a method for current oscillation suppression in a power switch is provided. The method includes in response to detecting a low current limit condition, entering a low current limit mode, and in response to detecting a high current limit condition, entering a high current limit mode. The method further includes in response to detecting a low current limit condition after being in the high current limit mode, entering a low current limit mode, and locking the current limit mode so that the current limit mode does not change.

The foregoing has outlined rather broadly the features and technical advantages of the embodiments in order that the detailed description of the embodiments that follows may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the invention. It should also be realized by those skilled in the art that such equivalent constructions do not depart from the spirit and scope of the embodiments as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a power switch implemented using a double-diffused metal oxide semiconductor (DMOS) transistor, wherein the power switch operating in a current limitation mode. The power switch as described is in a high side configuration. However, the invention may be applied to power switches in low side or bridge configurations. The invention may also be applied, however, to other power switches implemented using other transistor types, such as metal-oxide semiconductor field effect transistor (MOSFET), junction FET (JFET), bipolar, insulated-gate bipolar, and so forth. Additionally, the power switches may be capable of operating in a wide variety of operating modes in addition to the current limitation mode.

Figure 2A:
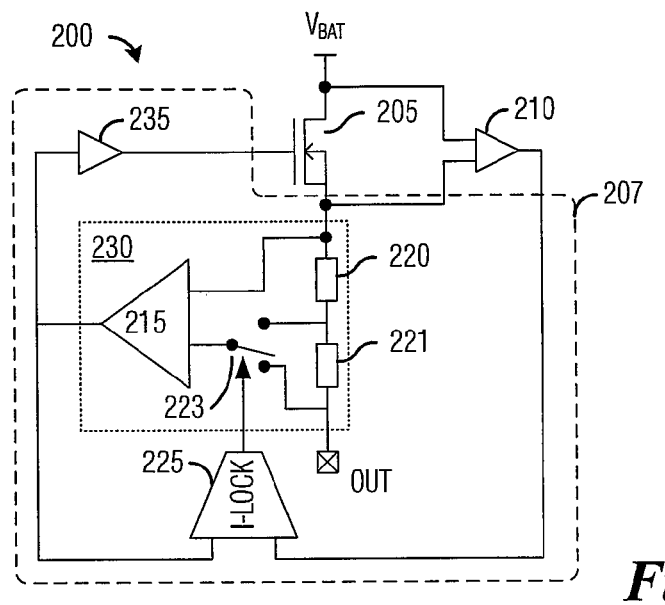
FIG. 2a is a diagram of a portion of a power supply.

With reference now to FIG. 2a, there is shown a diagram illustrating a portion of a power supply 200. The power supply 200 includes a power switch 205 and a current oscillation limitation circuit 207. The current oscillation limitation circuit 207 may be used in conjunction with the power switch 205 to limit current oscillation when the power switch 205 is operating in a current limitation mode. The power switch 205 may be a power switch with a current limitation. The power switch 205 may be implemented using a wide variety of transistor types. For example, as shown in FIG. 2, the power switch 205 is implemented as a DMOS transistor. However, other types of transistors may be used, including CMOS, bipolar, insulated-gate bipolar, and so forth. The power switch 205 as described is used in a high side configuration. However, the embodiments may be applied to power switches used in low side or bridge configurations.

The current oscillation limitation circuit 207 includes a monitor 210 that may be used to measure a drain-source voltage ($V_{DS}$) of the power switch 205. The monitor 210 may produce a $V_{DS}$ signal that is related to the drain-source voltage of the power switch 205.

The $V_{DS}$ signal (related to the drain-source voltage $V_{DS}$ and produced by the monitor 210) may be provided to an I-LOCK (current lock) unit 225. If the $V_{DS}$ signal indicates that the drain-source voltage $V_{DS}$ is greater than the threshold $V_{DSX}$, then the I-LOCK unit 225 may generate a current limitation lock signal that may be used to place a hold (lock) on the current limitation value used to limit a magnitude of the current flowing through the power switch 205. In addition to generating the current limitation lock signal based on the $V_{DS}$ signal, the I-LOCK unit 225 may also make use of a current operating mode of the power switch 205 in the generating of the current limitation lock signal. For example, if the power switch 205 is operating in a current limitation mode, then the I-LOCK unit 225 may generate the current limitation lock signal.

The current operating mode of the power switch 205 may be indicated by a control signal carried on a control signal line. The control signal may be generated by an I LIMITER (current limiter) unit 230. The control signal line may be coupled to a second input of the I-LOCK unit 225, providing the I-LOCK unit 225 with the current operating mode of the power switch 205.

In addition to generating the control signal indicating the current operating mode of the power switch 205, the I LIMITER unit 230 may be used to provide a gate control signal to a line driver 235 with an output of the line driver 235 may be coupled to a gate terminal of the power switch 205. The gate control signal may be used to control a state of the power switch 205. For example, the I LIMITER unit 230 may use the gate control signal to turn the power switch 205 on or off.

The I LIMITER unit 230 includes a differential amplifier 215 coupled to shunt resistors (RSHUNT1 220 and RSHUNT2 221). The differential amplifier 215 may be used to measure a current ($I_D$) flowing through the power switch 205. The differential amplifier 215 may measure a voltage drop across the shunt resistor 220 or the shunt resistors 220 and 221 (with the shunt resistor configuration being controlled by the I-LOCK unit 225) and may produce an output voltage proportional to the voltage drop, which may be related to the current flowing through the power switch 205.

The current limitation lock signal produced by the I-LOCK unit 225 may be used to control a switch 223 that may configure inputs of the differential amplifier 215 so that the differential amplifier 215 may amplify a voltage drop across the shunt resistor 220 or across both shunt resistors 220 and 221.

In summary, the I-LOCK unit 225 may generate the current limitation lock signal if (1) the power switch 205 is already operating in a current limitation mode and if (2) the drain-source voltage ($V_{DS}$) of the power switch 205 is more than the threshold ($V_{DSX}$). Preferably, event (1) occurs prior to event (2). When the I LIMITER unit 230 detects that the current limitation lock signal has been asserted by the I-LOCK unit 225, the I LIMITER unit 230 may provide the gate control signal to the line driver 235 to help ensure that the current flowing through the power switch 205 may be regulated by the low current limitation $I_{D\,LOW}$.

The power supply 200 is arranged in a high side configuration. However, the power switch 205 may also be used in low side or bridge configurations. Therefore, the discussion of the high side configuration should not be construed as being limiting to either the scope or the spirit of the embodiments.

Figure 2B:
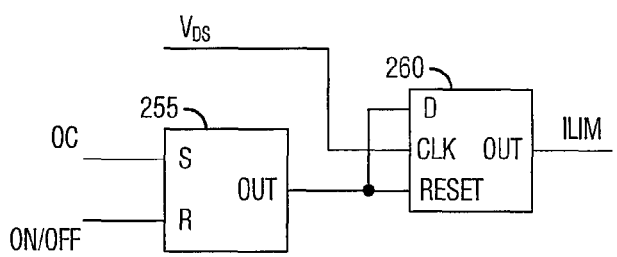
FIG. 2b is a diagram of an I-LOCK (current lock) unit.

FIG. 2b illustrates a detailed view of the I-LOCK unit 225. The I-LOCK unit 225 includes a RS flip flop 255 and a D flip flop 260. An S input of the RS flip flop 255 may be coupled to an output of the I LIMITER unit 230, which may provide an indicator of the current flowing through the power switch 205, while an R input of the RS flip flop 255 may be coupled to an on/off signal. An output of the RS flip flop 255 may be coupled to both a D input and a reset input of the D flip flop 260 and the drain-source voltage may be coupled to a clock input of the D flip flop 260. Therefore, when the RS flip flop 255 is set when the output of the I LIMITER unit 230 is high (logic one), then the D flip flop 260 may also become set to a logic one value, indicating that low current limitation $I_{D\ LOW}$ is being applied.

Figure 3:
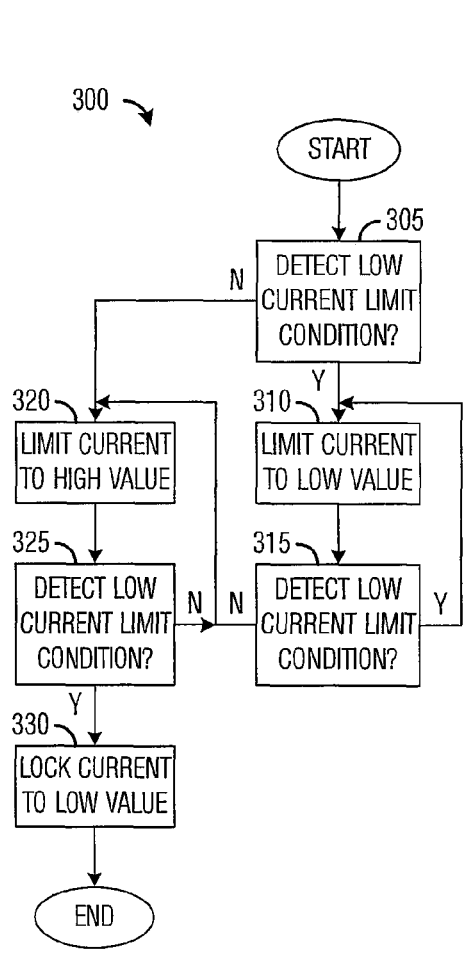
FIG. 3 is a diagram of a sequence of events in preventing current oscillation.

FIG. 3 illustrates a sequence of events 300 in preventing current oscillation. The sequence of events 300 may be descriptive of the operation of a power supply, such as the power supply 200, operating in a current limitation mode with circuitry to prevent current oscillation. The preventing of current oscillations may begin with a detection of a low current limit condition (block 305). If a low current limit condition is not detected, then a high current limitation $I_{D\ HIGH}$ may be used (block 320).

In general, when a power supply is operating in a current limitation mode, the current flowing through a power switch ($I_D$) may be regulated to one of several different current levels. The use of a current level may be based on factors such as a voltage drop ($V_{DS}$) across the power switch, and so forth. Therefore, the voltage drop $V_{DS}$ may be a low current limit condition. For example, in a two-level current limitation mode, there may be a high current limitation $I_{D\ HIGH}$ and a low current limitation $I_{D\ LOW}$ and a threshold ($V_{DSX}$) may be used in the selection of either the high current limitation $I_{D\ HIGH}$ or the low current limitation $I_{D\ LOW}$. Wherein, if the voltage drop $V_{DS}$ is less than the threshold $V_{DSX}$, then the high current limitation $I_{D\ HIGH}$ may be used, while if the voltage drop $V_{DS}$ is greater than the threshold $V_{DSX}$, then the low current limitation $I_{D\ LOW}$ may be used. In current limitation modes with different numbers of current levels, similar threshold comparisons may be used to select a current level for use in regulating the current flowing through the power switch. In addition to the voltage drop $V_{DS}$, another low current limit condition may be that the power switch is already operating with the low current limitation $I_{D\ LOW}$.

With the detection of a low current limit condition (block 305), then the low current limitation $I_{D\ LOW}$ may be used to regulate the current flowing through the power switch (block 310). As long as the low current limit conditions remain in place (block 315), the low current limitation $I_{D\ LOW}$ may continue to be used. In general, the regulation of the current flowing through the power switch, such as the power switch 205, may not result in current oscillations.

However, if the low current limit conditions no longer remain in place, i.e., a high current limit condition has been detected (block 315), then the high current limitation $I_{D\ HIGH}$ may be used (block 320). It may be permissible to allow for the current limitation to change from low to high as long as there are not multiple switches in current limitation values, which may indicate the occurrence of current oscillation. Therefore, after the detection of the high current limit condition, the current limitation may change to the high current limitation $I_{D\ HIGH}$. However, if after switching to the high current limitation $I_{D\ HIGH}$ the low current limit conditions are once again detected, which may be an indicator of current oscillations (block 325), then the current oscillations may be prevented by locking the low current limitation $I_{D\ LOW}$ for use in regulating the current flowing through the power switch (block 330) to prevent the current limit levels from changing as the voltage $V_{DS}$ changes. The locking of the low current limitation $I_{D\ LOW}$ may prevent current oscillations from occurring.

Figure 4:
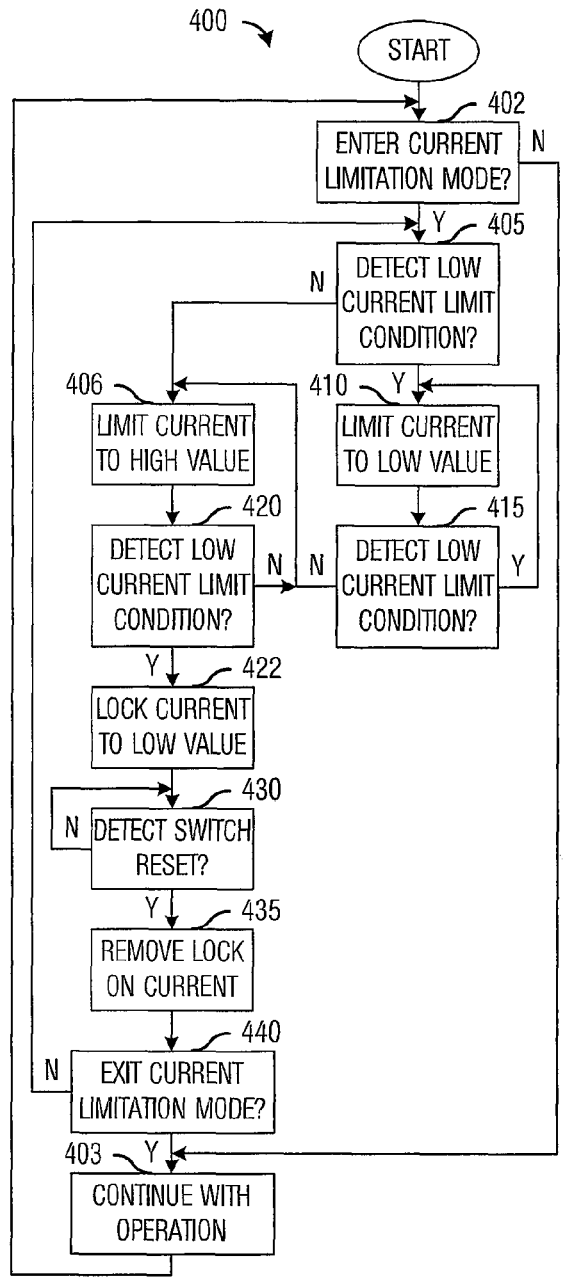
FIG. 4 is a diagram of a sequence of events in operating a power supply.

FIG. 4 illustrates a sequence of events 400 in the operation of a power supply. The sequence of events 400 may be descriptive of the operation of a power supply with the capability of operating in a variety of operating modes, including a current limitation mode, wherein the current limitation mode regulates a current flowing through a power switch of the power supply. The sequence of events 400 may include techniques to help prevent current oscillations. The operation of a power supply may begin with an entry into a current limitation mode (block 402). If the power supply does not enter the current limitation mode, then the power supply may continue with is current operating mode (block 403), which may include occasional checks for entering the current limitation mode (block 402).

If the power supply enters into a current limitation mode (block 402), then a check to detect a low current limit condition may be performed (block 405). As discussed previously, a low current limit condition may include a voltage $V_{DS}$ being larger than a threshold $V_{DSX}$, the power supply already operating with a low current limitation $I_{D\ LOW}$, and so forth. If a low current limit condition is not detected, then a high current limitation $I_{D\ HIGH}$ may be used (block 406).

If a low current limit condition is detected (block 405), then the low current limitation $I_{D\ LOW}$ may be used to regulate the current flowing through the power switch (block 410). In general, the regulation of the current flowing through the power switch may not result in current oscillations.

However, if the low current limit conditions no longer remain in place, i.e., a high current limit condition has been detected (block 415), then the high current limitation $I_{D\ HIGH}$ may be used (block 406). A high current limit condition may be similar to a low current limit condition in that it may be a condition that may cause the high current limitation $I_{D\ HIGH}$ to be used to regulate the current flowing through the power switch. An example of a high current limit condition may be a voltage $V_{DS}$ being smaller than a threshold $V_{DSX}$. Repetitive changes in the current limitation, e.g., high current limitation changing to low current limitation and back to high current limitation and so on, may be an indicator of the occurrence of current oscillations. Therefore, after the detection of the high current limit condition, the current limitation may change to the high current limitation $I_{D\ HIGH}$. However, if after switching to the high current limitation $I_{D\ HIGH}$ the low current limit conditions are once again detected (block 420), then the current oscillations may be prevented by locking the low current limitation $I_{D\ LOW}$ for use in regulating the current flowing through the power switch (block 422) to prevent the current limit levels from changing as the voltage $V_{DS}$ changes. The locking of the low current limitation $I_{D\ LOW}$ may prevent current oscillations from occurring.

Figure 1A:
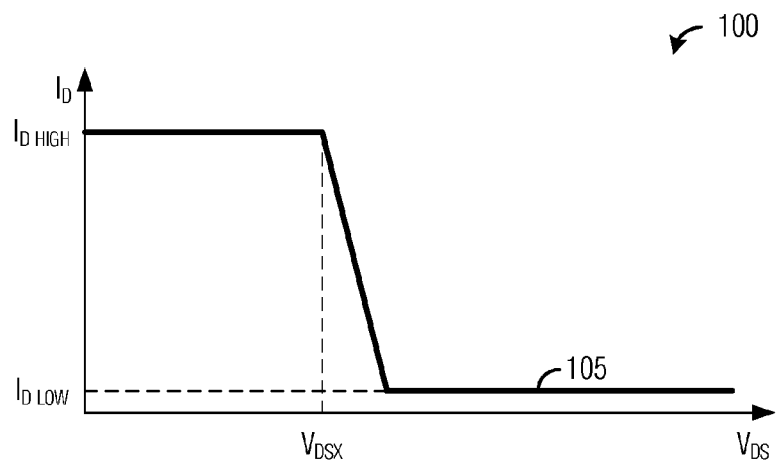
FIG. 1a is a diagram of a two-level current limitation.
Figure 1B:
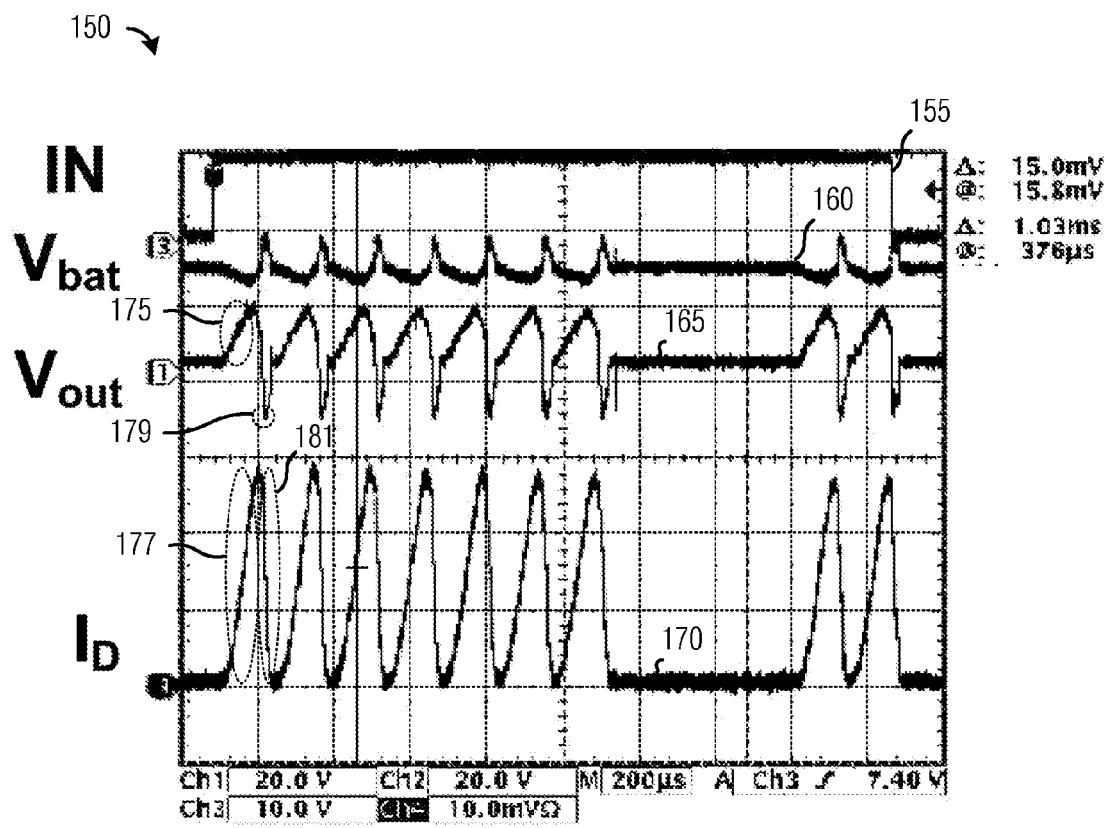
FIG. 1b is a diagram of a data plot displaying current oscillation.

In general, the power supply may continue operating in the current limitation mode with a low current limitation $I_{D\ LOW}$ until the power switch may be reset (block 430). The power switch may be reset when a switch control signal provided to the power supply changes value, such as seen in the trace 155 shown in FIG. 1b. If the power switch may be reset or purposefully taken out of the current limitation mode (block 430), then the lock on the low current limitation $I_{D\ LOW}$ may be removed (block 435). Furthermore, limitations on the voltage $V_{DS}$ may also be removed. If, after resetting the power switch the power supply exits the current limitation mode (block 440), then the power supply may continue operating in a desired operation mode with occasional checks for entering a current limitation mode (block 402). However, if after resetting the power switch and removing the lock on the low current limitation $I_{D\ LOW}$, the power supply remains in the current limitation mode, then a check for a high current limit condition may be performed (block 406).

Figure 5A:
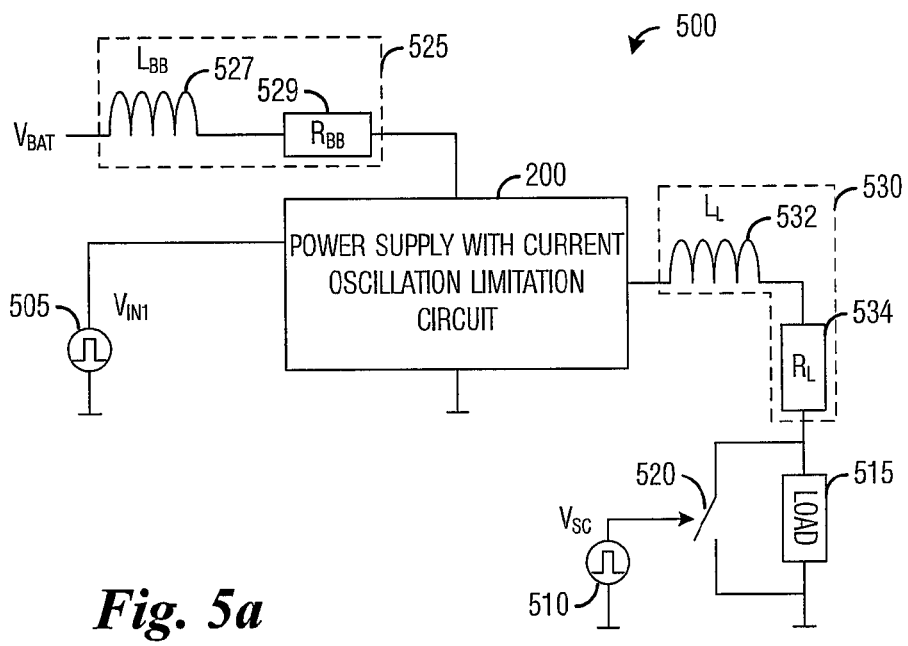
FIG. 5a is a diagram of a circuit for testing a power supply.

FIG. 5a illustrates a diagram of a circuit 500 for testing a power supply 200 with current oscillation limitation circuitry. The circuit 500 includes the power supply 200 with current oscillation limitation circuitry as discussed in FIG. 2a. The circuit 500 includes a control signal used to control a state of the power switch may be modeled by a pulse signal generator "$V_{IN1}$" 505 and a pulse signal generator "$V_{SC}$" 510 for use in creating a short circuit across a load 515 using a switch 520. Modeling of an impedance 525 of cabling/wiring used to connect a battery to the power supply 200 may be achieved with inductor 527 and resistor 529 and an impedance 530 of cabling/wiring used to connect the power supply 200 to the load 515 may be achieved using inductor 532 and resistor 534.

Figure 5B:
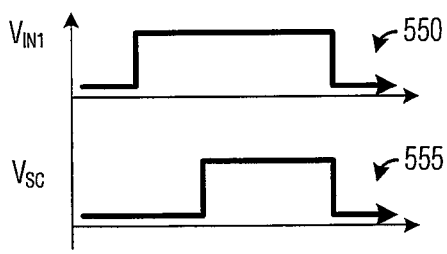
FIGS. 5b and 5c are diagrams of pulse waveforms.
Figure 5C:
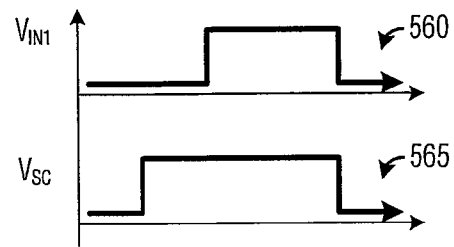

FIG. 5b illustrates a diagram of pulses produced by the pulse signal generator 505 generating the signal $V_{IN1}$ (shown as a first trace 550) and the pulse signal generator 510 generating the signal $V_{SC}$ (shown as a second trace 555). As shown in FIG. 5b, the control signal used to control the power switch may be turned on before the signal used to control the switch 520 is turned on. This may be illustrative of a short circuit type two. FIG. 5c illustrates a diagram of pulses produced by the pulse signal generator 505 generating the signal $V_{IN1}$ (shown as a third trace 560) and the pulse signal generator 510 generating the signal $V_{SC}$ (shown as a fourth trace 565). As shown in FIG. 5c, the control signal used to control the power switch may be turned on after the signal used to control the switch 520 is turned on. This may be illustrative of a short circuit type one.

Figure 6A:
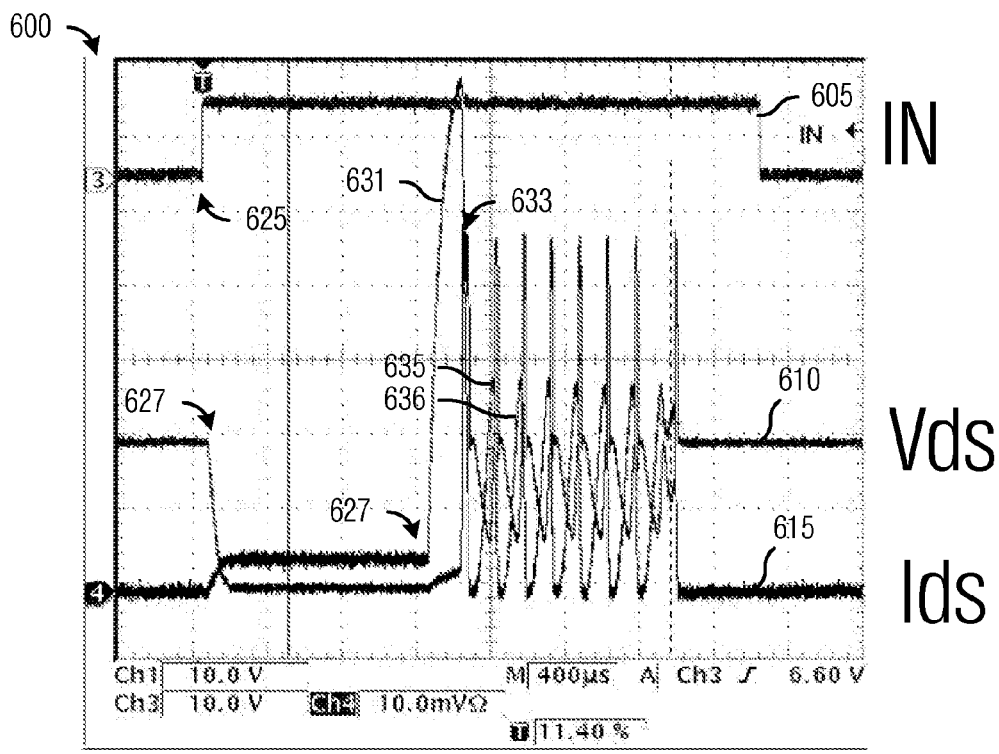
FIGS. 6a and 6b are diagrams of data plots of signals in a power supply.

FIG. 6a illustrates a data plot 600. The data plot 600 displays a first trace 605 displays a power switch control signal, such as $V_{IN1}$ (labeled "IN"), a second trace 610 displays a voltage drop across the power switch (labeled "$V_{DS}$"), and a third trace 615 displays a current flowing through the power switch (labeled "$I_{DS}$"). The traces displayed in the data plot 600 are measured from the circuit 500 with a power supply 200 with current oscillation limitation circuitry, wherein the current oscillation limitation circuitry is inactive.

At time T (shown as time event 625), the power switch may be turned on. As the power switch is turned on, the voltage $V_{DS}$ may begin to drop (shown as time event 627) and stabilize at a value. After the voltage $V_{DS}$ stabilizes, a short circuit occurs across the load 515 (e.g., switch 520 closes). This may be seen at time event 627 with a rapid rise in the current flowing through the power switch ($I_{DS}$), shown as pulse 631. This may also be seen as gradual increase in the voltage $V_{DS}$. When the current flowing through the power switch reaches the high current limitation $I_{D\ HIGH}$, the voltage $V_{DS}$ may rise and exceed the threshold $V_{DSX}$ (at time event 633), which may result in a switch in a current limitation level to the low current limitation $I_{D\ LOW}$, thereby causing the current flowing through the power switch to decrease (falling edge of the pulse 631). The oscillation of the current flowing through the power switch may continue as seen in pulse 635, pulse 636, and so forth.

Figure 6B:
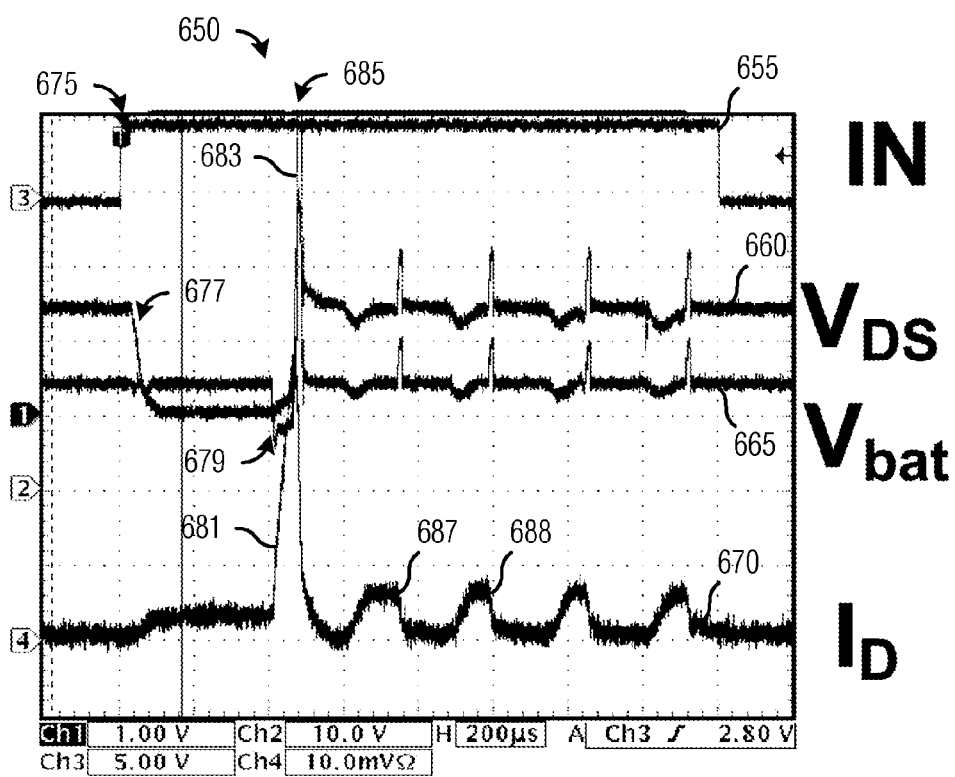

FIG. 6b illustrates a data plot 650. The data plot 650 displays a first trace 655 displays a power switch control signal, such as $V_{IN1}$ (labeled "IN"), a second trace 660 displays a voltage drop across the power switch (labeled "$V_{DS}$"), a third trace 665 displays a battery voltage (labeled "$V_{BAT}$"), and a fourth trace 670 displays a current flowing through the power switch (labeled "$I_D$"). The traces displayed in the data plot 650 are measured from the circuit 500 with a power supply 200 with current oscillation limitation circuitry, wherein the current oscillation limitation circuitry is active.

At time T (shown as time event 675), the power switch may be turned on. As the power switch is turned on, the voltage $V_{DS}$ may begin to drop (shown as time event 677) and stabilize at a value. After the voltage $V_{DS}$ stabilizes, a short circuit occurs across the load 515 (switch 520 closes). This may be seen at time event 679 with a drop in the battery voltage and corresponding rise in the voltage $V_{DS}$. The current flowing through the power switch may then begin to rise to a high current limitation $I_{D\ HIGH}$ (pulse 681). When the current flowing through the power switch reaches the high current limitation $I_{D\ HIGH}$, the voltage $V_{DS}$ may rise (shown as peak 683) and exceed the threshold $V_{DSX}$ (at time event 685), which may result in a switch in a current limitation level to the low current limitation $I_{D\ LOW}$, thereby causing the current flowing through the power switch to decrease (falling edge of the pulse 681).

However, the voltage $V_{DS}$ exceeding the threshold $V_{DSX}$ may be a fault condition as discussed previously and a detection of its occurrence may result in a lock being placed on the current flowing through the power switch.

Therefore, although the decrease in the voltage $V_{DS}$ may still result in an increase in the current flowing through the power switch, such as peak 687, peak 688, and so forth, the peaks may be substantially smaller in magnitude than the peaks (such as peaks 635 and 636) shown in FIG. 6a.

Although the embodiments have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method for current oscillation suppression in a power switch, the method comprising:
    in response to detecting a low current limit condition, entering a low current limit mode;
    in response to detecting a high current limit condition, entering a high current limit mode; and
    in response to detecting a low current limit condition after being in the high current limit mode,
        entering a low current limit mode, and
        locking the current limit mode in the low current mode so that the current limit mode is prevented from changing out of the low current mode.

2. The method of claim 1, wherein the in response to detecting a high current limit condition comprises in response to detecting a high current limit condition or to detecting no low current limit condition.

3. The method of claim 1, wherein the low current limit condition comprises a voltage drop across the power switch exceeding a first threshold and/or the power switch already operating with the current being limited to the low value.

4. The method of claim 3, wherein the detecting a low current limit condition after being in the high current limit mode comprises:
    detecting that the power switch is already operating in the high current limit mode; and
    detecting that the voltage drop across the power switch exceeding a first threshold after the detecting that the power switch is already operating in the high current limit mode.

5. The method of claim 1, wherein the low current limit mode comprises limiting a current flowing through a power switch to a current limit having a low value relative to other current values used to limit the current.

6. The method of claim 1, wherein the high current limit mode comprises limiting the current flowing through the power switch to a current limit having a high value relative to other current values used to limit the current.

7. The method of claim 1, further comprising, prior to the in response to detecting a low current limit condition, entering a current limiting mode.

8. A method for operating a power supply, the method comprising:
   entering a current limitation mode;
   setting a current limit for a current flowing through a power switch of the power supply;
   in response to determining that a current limit has changed from a high value to a low value,
       setting the current limit to the low value, and
       locking the current limit to the low value so that the current limit is prevented from changing from the low value; and
   providing a current to a load coupled to the power supply.

9. The method of claim 8, wherein a magnitude of the current is limited to be less than or equal to the current limit.

10. The method of claim 8, further comprising, in response to determining that the power switch has been reset, unlocking the current limit.

11. The method of claim 10, further comprising, after the unlocking, exiting the current limitation mode.

12. The method of claim 10, wherein the determining that the power switch has been reset comprises determining a change in a value of a switch control signal provided to the power supply.

13. The method of claim 8, wherein the setting a current limit comprises:
   setting the current limit to a low current limit relative to other current limits in response to a determining that a low current limit condition has occurred; and
   setting the current limit to a high current limit relative to other current limits in response to a determining that a high current limit condition has occurred.

14. The method of claim 13, wherein the low current limit condition comprises a condition where a voltage drop across the power switch exceeds a first threshold and/or a condition where the power switch already operates with the current being limited to the low current limit.

15. The method of claim 13, wherein the high current limit condition is a voltage drop across the power switch falling below a second threshold.

16. The method of claim 8, wherein setting the current limit to the low value comprises setting the current limit to the low value in response to a fault condition.

17. The method of claim 16, wherein the fault condition comprises a short circuit in the load.

18. The method of claim 8, wherein the setting a current limit is based on a measurement of a voltage drop across the power switch.

19. A power supply comprising:
   a power switch coupled to a voltage source, the power switch configured to provide a load current to a load coupled to the power supply;
   a monitor having a first input coupled to a first terminal of the power switch and a second input coupled to a second terminal of the power switch, the monitor configured to measure a voltage drop across the power switch;
   a current limit unit coupled to the second terminal of the power switch and to an output of the power supply, the current limit unit configured to produce a power switch control signal for use in regulating a power switch current based on a current limit, wherein the power switch current flows through the power switch, the current limit unit comprising
       a first shunt resistor and a second shunt resistor serially coupled in between the second terminal of the power switch and the output of the power supply, and
       a differential amplifier having a first input coupled to the second terminal of the power switch and a second input switchably coupled to a node between the first shunt resistor and the second shunt resistor or the output of the power supply, the differential amplifier configured to amplify a voltage drop across the first shunt resistor or both the first shunt resistor and the second shunt resistor; and
   a current lock unit coupled to the monitor and to the current limit unit, the current lock unit configured to produce a current lock control signal to force the power switch current to be less than or equal to a threshold, wherein the current lock control signal is based on the voltage drop across the power switch and the current limit used in regulating the power switch current.

20. The power supply of claim 19, wherein the current limit unit is further configured to assert a true value on a low limit control signal when the current limit is a low current limit relative to other current limits.

21. The power supply of claim 20, wherein the current lock unit is further configured to force the power switch current to be less than or equal to the threshold independent of the voltage drop across the power switch if a true value is asserted on the low limit control signal.

* * * * *